(12) United States Patent
Lai et al.

(10) Patent No.: US 6,780,783 B2
(45) Date of Patent: Aug. 24, 2004

(54) METHOD OF WET ETCHING LOW DIELECTRIC CONSTANT MATERIALS

(75) Inventors: Jane-Bai Lai, Hsin-Chu (TW); Pei-Fen Chou, Hsin-Chu (TW)

(73) Assignee: Taiwan SEmiconductor Manufacturing Co., Ltd., Hsin Chu (TW)

( * ) Notice: Subject to any disclaimer, the term of this patent is extended or adjusted under 35 U.S.C. 154(b) by 98 days.

(21) Appl. No.: 09/941,356

(22) Filed: Aug. 29, 2001

(65) Prior Publication Data

US 2003/0049938 A1 Mar. 13, 2003

(51) Int. Cl.⁷ .................. H01L 21/302; C09K 13/00; C09K 13/04; C09K 13/08
(52) U.S. Cl. .................. 438/745; 252/79.1; 252/79.2; 252/79.3
(58) Field of Search .................. 438/745; 252/79.1, 252/79.2, 79.3

(56) References Cited

U.S. PATENT DOCUMENTS

| | | | | |
|---|---|---|---|---|
| 4,199,337 A | * | 4/1980 | Asam | 65/3 |
| 4,846,929 A | * | 7/1989 | Bard et al. | 156/630 |
| 5,055,416 A | * | 10/1991 | Weber | 437/4 |
| 5,559,055 A | * | 9/1996 | Chang et al. | 437/195 |
| 5,744,865 A | * | 4/1998 | Jeng et al. | 257/750 |
| 5,977,635 A | * | 11/1999 | Tobben et al. | 257/760 |
| 6,078,088 A | * | 6/2000 | Buyonski | 257/410 |
| 6,080,640 A | * | 6/2000 | Gardner et al. | 438/455 |

* cited by examiner

Primary Examiner—Nadine G. Norton
Assistant Examiner—Lynette T. Umez-Eronini
(74) Attorney, Agent, or Firm—Tung & Associates (57) ABSTRACT

A method of etching a low dielectric constant material with an aqueous solution of hydrofluoric acid and hydrochloric acid. The etching solution is particularly useful on low dielectric constant materials that are water repulsive or hydrophobic. The weight ratio of hydrofluoric acid to hydrochloric acid in the aqueous solution ranges from 1:3 to 4:1.

14 Claims, 5 Drawing Sheets

Providing or Forming a Semiconductor Device having Two Metal Interconnects and a Low Dielectric Constant Material There Between

↓

Etching the Low Dieletric Constant Material with an Aqueous Solution Including HF and HCL

↓

Analyzing the Etched Device with a Scanning Electron Microscope

(Prior Art)
FIG. 2K (Prior Art)
FIG. 2L (Prior Art)
FIG. 2M (Prior Art)
FIG. 2N Providing or Forming a Semiconductor Device having Two Metal Interconnects and a Low Dielectric Constant Material There Between

↓

Etching the Low Dieletric Constant Material with an Aqueous Solution Including HF and HCL

↓

Analyzing the Etched Device with a Scanning Electron Microscope

FIG. 3

METHOD OF WET ETCHING LOW DIELECTRIC CONSTANT MATERIALS

FIELD OF THE INVENTION

This invention relates to a method of etching low dielectric materials, and more particularly to a method of wet etching low dielectric materials using an aqueous solution.

BACKGROUND OF THE INVENTION

Wafer metallization involves the deposition of thin film of conductive metal onto the wafer using a chemical or physical process. Metal lines conduct the signal through the integrated circuit and dielectric lines insure that signals are not influenced by adjacent lines. The deposition of metal and dielectrics are thin film processes.

With regard to metallization, the term interconnect describes the conductor materials, such as aluminum, polysilicon, or copper, that create the metal wiring that carries electrical signals to different parts of the chip. Interconnect is also used as a general term for the wiring between devices on the die and/the overall package. A contact is an electrical connection at the silicon surface between devices in the silicon wafer and the first metal layer. Vias are openings that extend through the various dielectric layers to form an electrical pathway from one metal layer to the adjacent metal layer. A metal plug fills the vias to form an electrical connection (interconnect) between two metal layers.

An interlayer dielectric is an insulating material that electrically separates and insulates metal levels. After the interlayer dielectric is deposited, the interlayer dielectric is patterned and etched to form via pathways for the various metal layers. This process of creating vias in the interlayer dielectric is repeated for every interlayer dielectric on the die. In traditional processes, a blanket layer of aluminum alloy is deposited on the dielectric layer and then patterned and etched to form metal lines.

Figure 1:
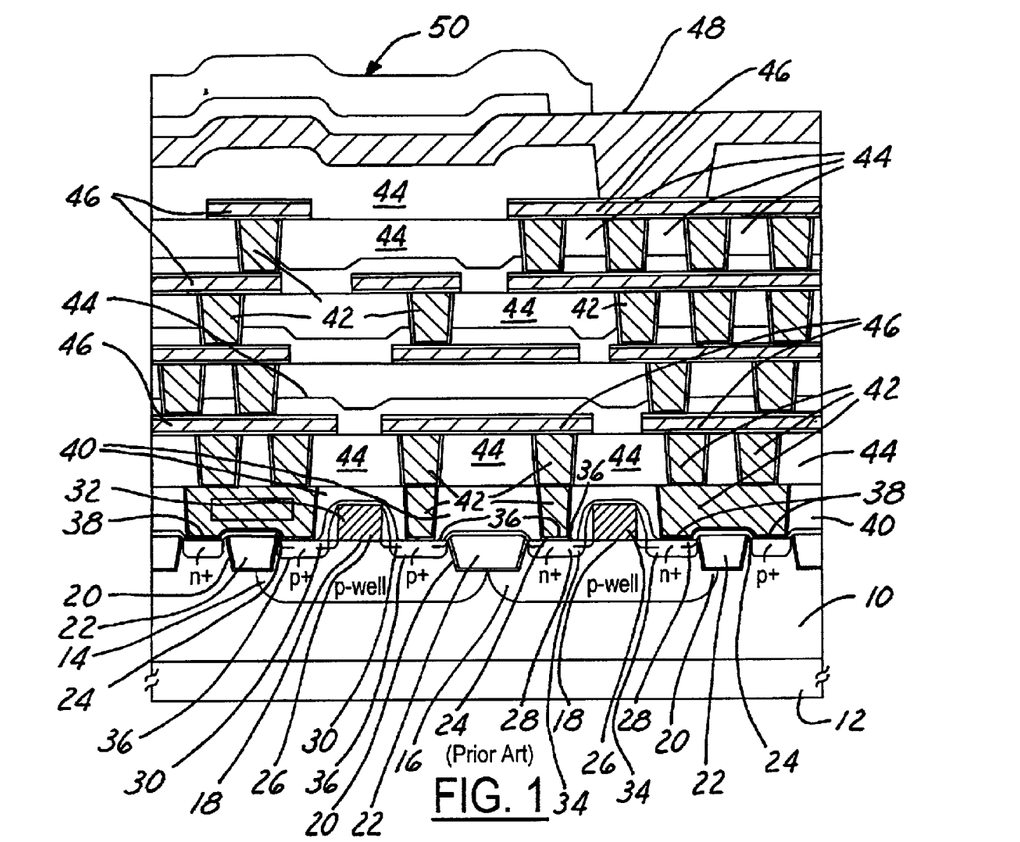
FIG. 1 illustrates a prior art semiconductor device having a plurality of metal interconnects and an interlayer dielectric between metal interconnects.

FIG. 1 illustrates a semiconductor device having metal interconnect layers and interlayer dielectrics that may be wet etched according to the present invention. A brief description of the structure and the method of manufacturing will provide for a better understanding of the usefulness of the process of the present invention. The semiconductor device is manufactured using a variety of process steps. For example, an epitaxial layer is grown on the wafer. The wafer is cleaned in a number of different chemical baths to remove particles, organic and inorganic contaminants, and native oxide on the wafer. A first level interlayer dielectric is grown on the wafer by flowing oxygen in a process chamber to react with silicon thus producing a silicon dioxide first level interlayer dielectric. A first mask, using a photoresist, is developed and patterned using photolithography with openings therein. The patterned wafer is exposed to high-energy ions that penetrate into the upper surface of the epitaxial layer. For example, phosphorus may be utilized to create the dopant ions creating a $n^-$ well 14. Thereafter, the photoresist is stripped, (for example using an ion plasma reactor) and then the wafer is cleaned to remove any residual photoresist. The implanted wafer may be annealed in a furnace to provide a barrier oxide layer and to drive (diffuse) the dopants further into the silicon.

A second photoresist mask is selectively developed over the upper layer of the semiconductor device. Boron ions are implanted into the device through openings in the photoresist to create a $p^-$ well 16. Then the product is annealed again.

A barrier oxide layer is formed by placing the wafer in a high temperature oxygen furnace. This protects the active regions in the device from chemical contamination that might occur during subsequent process steps. The wafer is then exposed to a low-pressure chemical vapor deposition furnace in the presence of ammonia and dichlorosilane gases to produce a thin layer of silicon nitride. A third photoresist mask is selectively deposited onto the silicon nitride layer. The photoresist pattern is designed to protect areas of the silicon that are not to be etched. A dry plasma etcher is used to etch trenches in the device.

The etched trench is filled with a silicon dioxide layer 20 by placing the wafer in a high temperature oxide furnace so that silicon dioxide is grown in the exposed walls of the isolation trenches. A nitride mask prevents oxygen diffusion into the active regions. The remainder of the trench is filled with silicon dioxide 22 using low-pressure chemical vapor deposition. The low-pressure chemical vapor deposition of silicon dioxide also covers the entire wafer surface. Therefore, an oxide chemical mechanical planarization step is conducted.

A thin layer of silicon dioxide 24 may be grown on the wafer. Thereafter, polysilicon is deposited using low-pressure chemical vapor deposition with silane. A fourth mask is patterned and developed. A plasma is utilized to remove unwanted polysilicon and to leave a polysilicon gate 26.

A fifth mask is patterned and developed, and a lightly doped $n^-$ well is formed in the device using for example arsenic or phosphorus. Thereafter the fifth mask is removed. A sixth mask is selectively deposited over the device and lightly doped $n^-$ drain 30 areas are implanted using boron or boron difluoride.

Side wall spacers 32 may be formed by depositing silicon dioxide using chemical vapor deposition. This layer of silicon dioxide is used to form spacers on the sides of the polysilicon gates. A plasma etcher is used to remove most of the oxide leaving behind sidewalls on the polysilicon gate.

A seventh mask is selectively developed on the device and a high dose of arsenic is implanted to form $n^+$ source/drain regions 34 are formed and the photoresist removed. Similarly, an eighth mask is selectively deposited and a high dose of boron is implanted to form $p^+$ source/drain regions 36 are implanted into the device and the photoresist removed.

Metal contacts 38 are formed over the active regions of the silicon. Preferably, titanium is deposited on the wafer using a sputtering process. The wafer is annealed in a furnace to trigger a chemical reaction between the titanium and the silicon to form tisilicide. The unwanted titanium is etched away leaving behind a metal contacts over the active regions of the silicon.

A barrier layer of silicon nitride (not numbered) is preferably deposited using a chemical vapor deposition process. The silicon nitride protects the active regions. Thereafter a local interconnect oxide layer 40 is deposited over the silicon nitride layer. Preferably the local interconnect oxide layer is doped silicon dioxide. Chemical mechanical planarization is performed on the local interconnect oxide layer. Thereafter, a ninth mask is selectively deposited on the wafer and trenches are etched through the first level interlayer dielectric.

A thin layer of materials such as titanium (not numbered) is deposited into the trenches formed in the first level interlayer dielectric. The titanium nitride layer (not numbered) is deposited over the titanium to serve as a diffusion barrier. The trench is filled with tungsten using a chemical vapor deposition step that coats the entire wafer. A chemical mechanical planarization step is performed to polish the tungsten down to the local oxide thus forming a first portion of a metal plug (interconnect) 42 in the local oxide portion of the first level interlayer dielectric.

A first level interlayer dielectric 44 is deposited over the local interconnect oxide using chemical vapor deposition. Oxide chemical mechanical planarization is used to planarize the first level interlayer dielectric 44. Thereafter, a 10th mask is selectively developed on the first level interlayer dielectric 44 and vias are etched through the dielectric down to the tungsten. A thin layer of titanium is deposited across the surface of the wafer using physical vapor deposition. The titanium will line the walls of the via holes formed in the first level interlayer dielectric. Titanium nitride is thinly deposited on top of the titanium layer to serve as a diffusion barrier for the tungsten that will be deposited in the vias formed in the first layer interlayer dielectric. Using chemical vapor deposition tungsten is deposited into and fills the vias formed in the first level interlayer dielectric. Thereafter, the tungsten is polished down to the upper surface of the first level interlayer dielectric to provide a metal plug (interconnect) 42 through the first level interlayer dielectric 44 and the local interconnect dioxide down to the metal contacts formed on the active regions of the silicon.

A first level metal interconnect (metal stack or sandwich) 46 is formed on top of the first level metal plugs. A titanium layer may be deposited over the entire wafer. The first level metal interconnect may be formed by sputtering an aluminum-Cu alloy over the wafer. A titanium nitride layer may be deposited on top of the aluminum-Cu layer. An 11th mask is selectively deposited over the titanium nitride layer and selective portions of the aluminum-Cu layer are etched away to form a first level metal interconnect 46.

A second level interlayer dielectric 44 may be formed by providing an interlayer dielectric gap fill which deposits silicon dioxide using a high-density plasma chemical vapor deposition process. This provides a dense oxide between gaps in the metal interconnect. The remainder of the second level interlayer dielectric may be formed by depositing silicon dioxide using plasma enhanced chemical vapor deposition. The second level interlayer dielectric 44 is planarized using oxide chemical mechanical planarization. A 12th mask is selectively formed over the second level interlayer dielectric and vias etched in the second level interlayer dielectric. The above described process steps are repeated to form multiple levels of metal interconnect wherein the various levels of metal interconnect and the metal plugs are isolated by the interlayer dielectric. Traditionally, the various levels of interlayer dielectric are silicon dioxide, but may be a low dielectric constant material as will be described in greater detail below. Finally, a bonding pad material may be deposited and connected to one of the metal interconnects. A passivation layer may be selectively deposited over the device with openings down to the bonding pad metal.

The demands of increased device densities and faster chip speeds and has caused those in the semiconductor manufacturing industry and to look to new materials for metallization and dielectric isolation. There is a trend in the industry currently to replace the traditional metallization of aluminum and tungsten in favor of the use of copper. Copper provides a number of benefits. Copper interconnect wiring greatly reduces the resistivity from about 2.65 micro-ohms-cm for aluminum to 1.670 micro-ohms-cm for copper at standard temperature. This reduces the RC signal delay and increases chips speed. Copper can be deposited in much narrower lines thus reducing power consumption. These narrower lines permit tighter circuit packing which means fewer levels of metal are needed. Further, copper has superior resistance to electromigration. It is possible for copper to potentially have 20–30 percent fewer processing steps using the demascene processing methods for copper. This means that the chip fabricated with copper can handle higher electrical power densities.

However, there are a number of challenges associated with using copper to manufacture device interconnections. First, copper diffuses quickly into oxides and silicon. If the copper diffuses into the active regions of the silicon, it will damage the device by creating junction or oxide leakage. Second, copper cannot be easily patterned using regular plasma etching techniques. Copper dry etching does not produce a volatile by product during the chemical reaction that is necessary for cost-effective dry etching. Finally, copper oxidizes in air at low temperatures and does not form a protective layer to stop further oxidation.

The problems associated with using copper are addressed using the demascene processing technique. The demascene processing technique avoids copper etching. The technique creates both vias in lines for each metal layer by etching holes and trenches in interlayer dielectrics, depositing the copper and the features, and using chemical mechanical planarization to remove excess copper. For dual-demascene processing, a two tiered metal inlay is created including a series of vias in addition to interconnect trench from metal lines. The vias in metal line levels are filled with copper which saves a process step and eliminates the interface between the via and the metal line. An etch stop material may be added such as silicon nitride ($Si_3N_4$ or $Si_xN_y$) as a hard mask at the bottom of the via to control how deep etching occurs in the formation of the via. The details of the process are described below.

Figure 2A:
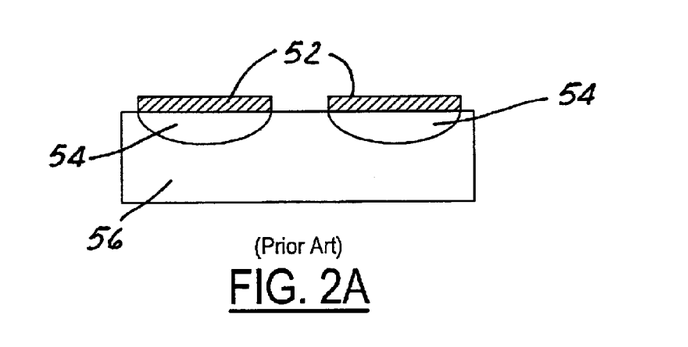
FIG. 2A illustrates a prior art method of forming metal contacts over active regions in a semiconductor device.
Figure 2B:
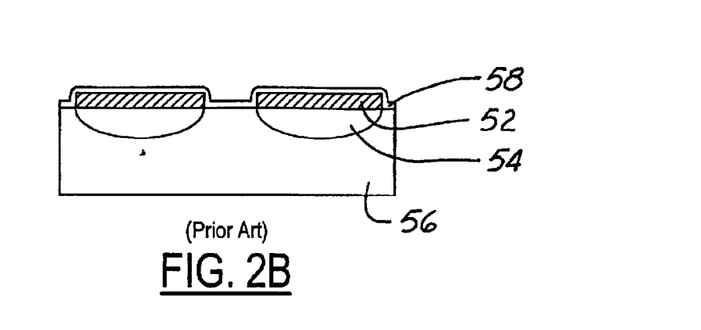
FIG. 2B illustrates a prior art method of forming an etch stop layer over the metal contacts of FIG. 2.
Figure 2C:
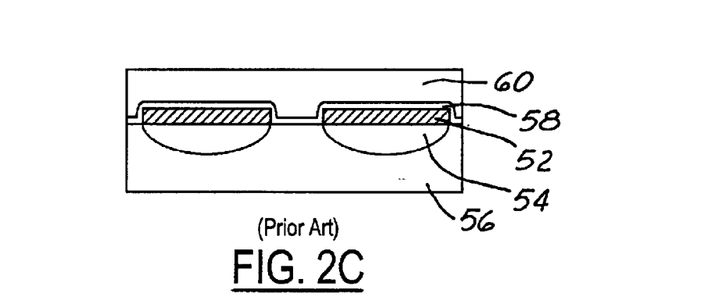
FIG. 2C illustrates a prior art method of forming a local oxide layer over the metal contacts of FIG. 2B.
Figure 2D:
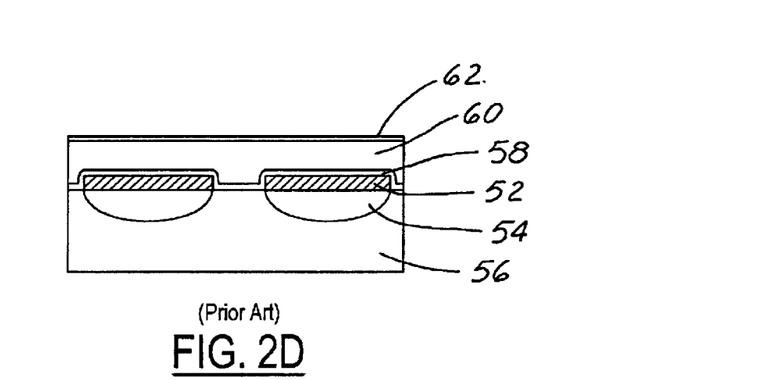
FIG. 2D illustrates a prior art method of forming an etch stop layer over the local oxide layer of FIG. 2C.
Figure 2E:
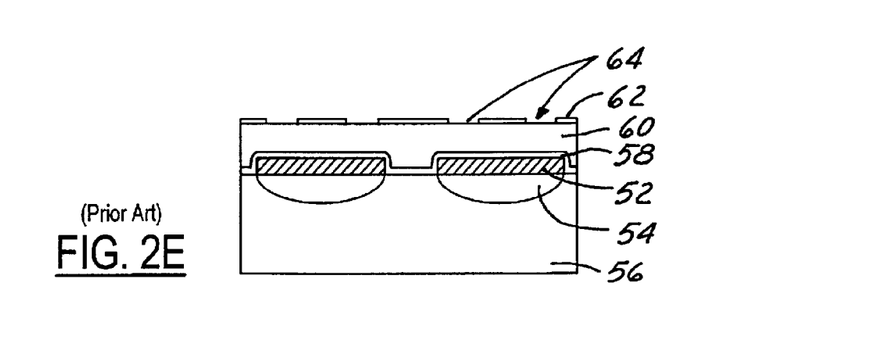
FIG. 2E illustrates a prior art method of patterning and dry etching openings in the etch stop layer of FIG. 2D.

FIGS. 2A–N illustrate the steps of a demascene process. Metal contacts 52 are formed over active regions 54 (for example active regions as described above) in a semiconductor wafer 56 (FIG. 2A). An etch stop layer 58, preferably silicon nitride or SiC, is deposited over the semiconductor wafer and metal contacts 52 (FIG. 2B). A first level interlayer dielectric 60 is deposited over the etch stop layer 58 and preferably comprises silicon dioxide. The silicon dioxide may be deposited using plasma enhanced chemical vapor deposition to a desired thickness for the formation of vias therein. Since there is no critical gap fill requirements, plasma enhanced chemical vapor deposition of the silicon dioxide is an acceptable method of forming this first level interlayer dielectric. As will be discussed later, low dielectric constant (K) materials may be substituted for the silicon dioxide used in this first layer interlayer dielectric 60 and in subsequent level interlayer dielectrics. The first level interlayer dielectric 60 is then planarized (FIG. 2C). Thereafter, a second etch stop layer 62 is deposited onto the first level interlayer dielectric (FIG. 2D). It is preferable for the silicon nitride to be very dense and pinhole free and therefore high-density plasma chemical vapor deposition is a preferred process step of depositing this etch stop layer. Photolithography is used to pattern dry etch via openings 64 in the silicon nitride and the photoresist used in the process is stripped (FIG. 2E).

Figure 2F:
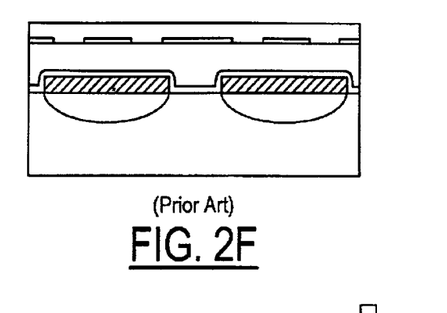
FIG. 2F illustrates a prior art method of forming an interlayer dielectric over the local oxide layer of FIG. 2E.
Figure 2G:
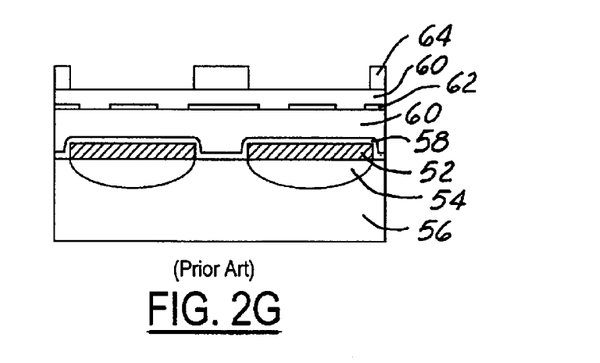
FIG. 2G illustrates a prior art method of patterning photoresist over the interlayer dielectric of FIG. 2F.
Figure 2H:
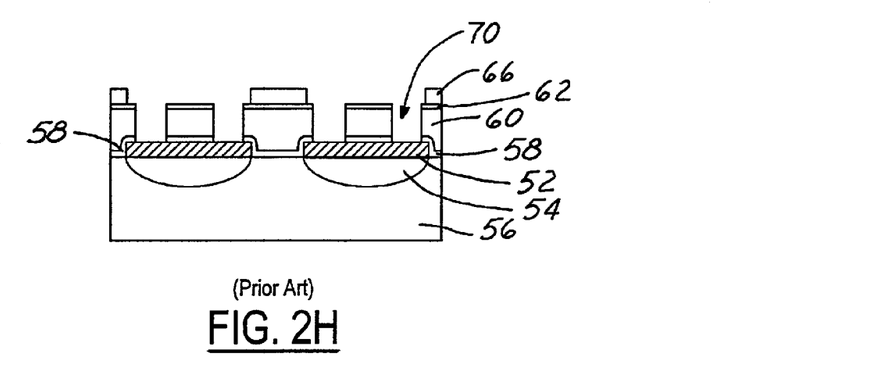
FIG. 2H illustrates a prior art method of etching a trench down to the metal contacts on the semiconductor wafer.

The remaining portion of the interlayer dielectric, in this case silicon dioxide, is deposited using plasma enhanced chemical vapor deposition (FIG. 2F). Interconnect patterning is accomplished using photolithography to pattern the silicon dioxide with a photoresist layer (FIG. 2G). A trench 70 is dry etched in the interlayer dielectric oxide stopping on the lower silicon nitride layer which was deposited above the metal contacts 52. The etch continues to form via openings by passing through the openings in the patterned silicon nitride layer 62 (FIG. 2H).

Figure 2I:
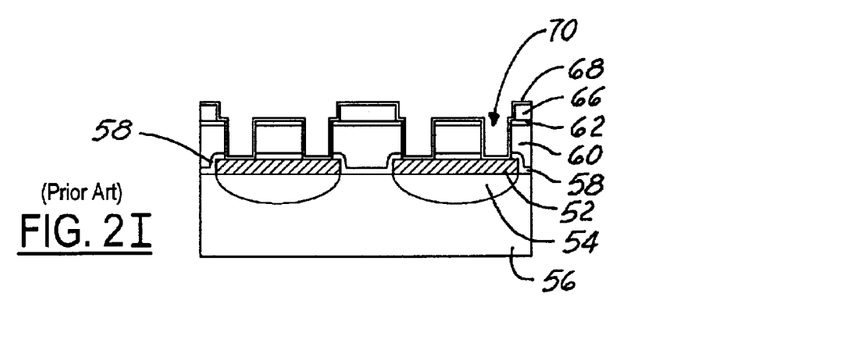
FIG. 2I illustrates a prior art method of depositing a diffusion barrier layer on to the side walls of the trench and via.
Figures 2J, 2K:
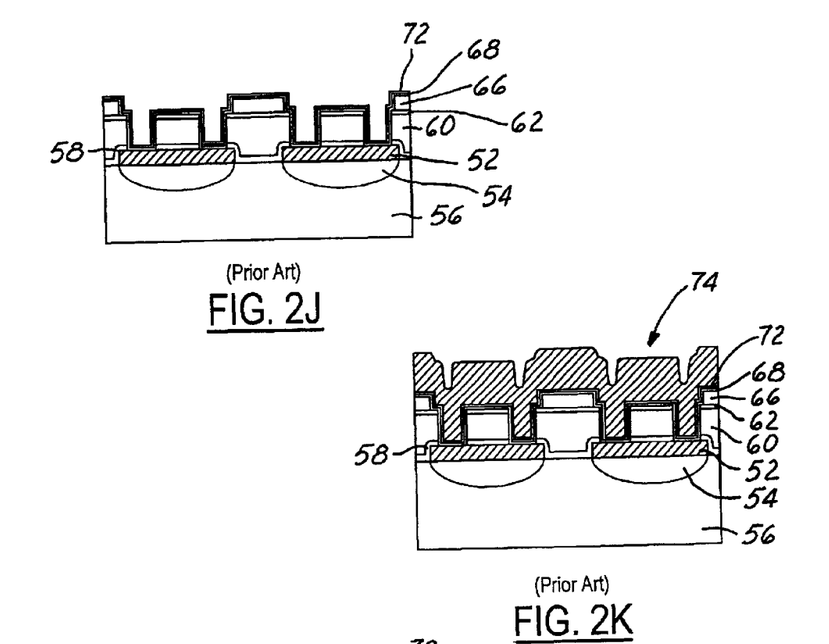
FIG. 2J illustrates a prior art method of depositing a copper seed layer.
FIG. 2K illustrates a prior art method of filling the trench and via with copper.
Figure 2L:
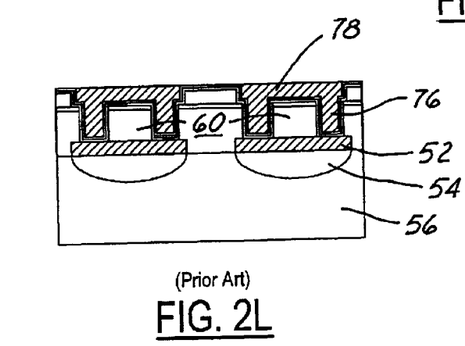
FIG. 2L illustrates a prior art method of removing excess copper with chemical mechanical planarization.
Figure 2M:
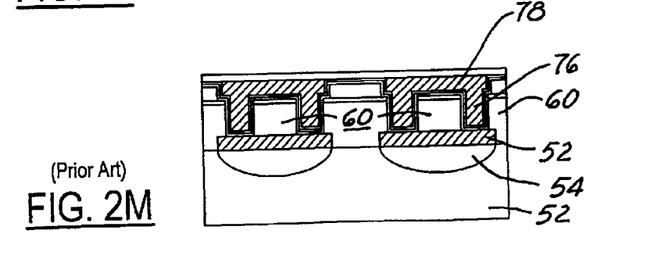
FIG. 2M illustrates a prior art method of forming an etch stop layer over the copper metal plug and metal interconnect of FIG. 2L.
Figure 2N:
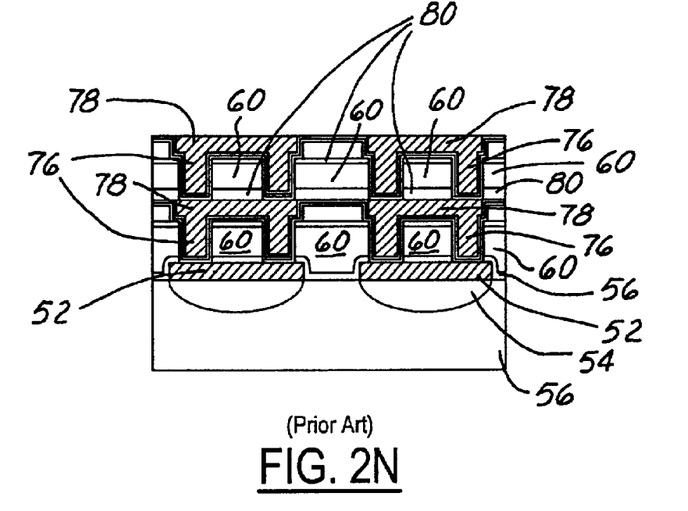
FIG. 2N illustrates a prior art semiconductor device having multiple layers of metal interconnect and an interlayer dielectric layer between metal interconnect layers.

Preferably a barrier metal is deposited into the trench to prevent the diffusion of the copper that will be subsequently deposited. In this case, Ta or TaN is deposited with ionized plasma vapor deposition on the bottom and sidewalls of the trench and via (FIG. 2I). Preferably a seed layer of copper 72 is deposited using chemical vapor deposition in a manner which is uniform and free of pinholes (FIG. 2J). Thereafter, the trench and via is filled with copper 74 for example by electrochemical deposition (FIG. 2K). The excess copper is removed using copper chemical mechanical planarization (FIG. 2L). This planarizes the surface and prepares for the next level. This demascene process provides the metal plugs 76 and metal interconnect (wiring) 78 in one process step and eliminates the interface between the via and the metal line required in the traditional method of processing. A new etch stop layer 80 of silicon nitride or SiC is deposited (FIG. 2M) and the above process steps repeated to provide multiple (2) layers of metal interconnect illustrated by the structure shown in FIG. 2N. A semiconductor device having eight metal interconnect layer has been successfully manufactured using this process.

The silicon dioxide used as the interlayer dielectric in the traditional method and in the copper damascene method has a dielectric constant of about 4.0. This is insufficient for the current increased requirements for higher device density and greater speeds. A variety of new low dielectric constant materials, having a dielectric constant less than 3.8, are being developed and utilized in current semiconductor manufacturing. Such low-level dielectric materials include, but are not limited to, doped glasses such as fluorosilicate glass, organic based materials, organosilicon films such as those formed from a compound having a molecular formula of R—Si—R' where R and R' are the same or different, and where R or R' may be a hydrocarbon derivative group typically comprising a methyloxy group (—OCH$_3$) or ethyloxy group (—OC$_2$H$_5$). Some low dielectric constant materials are sold under trade names BLACK DIAMOND available from Applied Materials Corp., CORAL available from Nouvelles Corp., and SILK available from Dow Chemical Co. However, these low dielectric constant materials present unique challenges with respect to etching and stripping, in particular with respect to metrology, defect inspection and repair.

Semiconductor devices can be manufactured utilizing the above traditional process steps or the copper damascene process steps, and utilizing low dielectric materials for interlayer dielectric between metal interconnect layers. At various stages during the manufacturing process and near completion of the product, measurements and inspection of various components, particularly metal interconnect layers is important for quality control and repair. The scanning electron microscope (SEM) has been predominantly used to verify acceptable critical dimensions in all submicron generations. The SEM can achieve magnifications from 100,000–300,000. The SEM includes focusing elements for shaping electrons into a beam, and is significantly more effective than optical microscopes. A cross-section of a wafer viewed with a SEM can provide defect information, an effective control over submicron line widths. The SEM functions by creating a highly focused beam of electrons that scans an object while detectors measure the resulting scattered electrons.

Another tool for examining, analyzing, and repairing processing layers is a focused ion beam (FIB) System. The FIB system uses a destructive technique, but operates similar to the SEM. An exception is that the FIB system uses a primary beam that is made from Gallium ions instead of electrons. These ions are focused by a lens into a small precise area that impacts the wafer, and wherein atoms are ejected into a vacuum creating a small void of a precisely controlled shape and depth. This precision gives the FIB the ability to make cross-sections and specific locations of the wafer.

As indicated earlier, the semiconductor devices include metal interconnect layers separated from each other by an interlayer dielectric which preferably is a low dielectric constant material. When device is examined under a SEM or cross-sectioned using a FIB it often becomes impossible to distinguish among the various interlayer dielectric materials. Thus, it becomes necessary to etch or remove the interlayer dielectric layers. If the interlayer dielectric layers were based on oxide films they could be etched or removed using an a traditional buffered oxide etch (BOE) which is a wet etch of hydrofluoric acid (HF). The hydrofluoric acid is often diluted in water and buffered with ammonium fluoride. However, low dielectric constant materials repulse water or are hydrophobic. Therefore the traditional BOE cannot be utilized to etch or remove these types of low dielectric layers. Reactive ion etch is a technique for removing material from a wafer surface with both a reactive chemical process and a physical process using ion bombardment. However, it is difficult to control the end point using reactive ion etching and it is difficult to avoid damage to the metal lines. Thus it would be desirable to provide a method of etching low dielectric materials without damaging metal lines. The present invention overcomes deficiencies in the prior art and provides alternatives thereto.

SUMMARY OF THE INVENTION

The present invention includes a method of etching a low dielectric constant material in an aqueous solution of hydrofluoric acid and hydrochloric acid. The weight ratio of hydrofluoric acid to hydrochloric acid in the solution may range from 1:3 to 4:1.

In another embodiment of the present invention, the low dielectric constant material includes —OR groups where R is a hydrocarbon derivative.

In another embodiment of the present invention the low dielectric constant material includes methyloxy groups.

In another embodiment of the present invention the low dielectric constant material includes methyloxy groups.

In another embodiment of the present invention the aqueous solution includes deionized water in a weight ratio to each of the hydrofluoric acid and hydrochloric acid ranging from 1:1 to 5:1.

In another embodiment of the present invention the low dielectric constant material includes $Si(CH_3)_xO_{2-x}$.

In another embodiment of the invention the low dielectric material is hydrophobic.

Another embodiment of the invention includes a method of forming a semiconductor device having at least two metal interconnect layers and a low dielectric constant material between the metal interconnect layers. The device is etched in an aqueous solution of HF and HCl. The etched device is analyzed in a scanning electron microscope.

In another embodiment of the invention the weight ratio of HF to hydrochloric acid in the solution ranges from 1:3 to 4:1.

In another embodiment of the invention the low dielectric constant material includes —OR groups where R is a hydrocarbon derivative.

In another embodiment of the invention the low dielectric constant material includes methyloxy groups.

In another embodiment of the invention the low dielectric constant material includes ethyloxy groups.

In another embodiment of the invention the metal interconnect consists essentially of copper.

In another embodiment that the invention the step of etching the device is carried out by dipping the device in a bath of the aqueous solution of HF and HCl.

In another embodiment that the invention, the low dielectric constant material has a dielectric constant less than 3.8.

In another embodiment of the invention the low dielectric constant material comprises a fluorosilicate glass.

In another embodiment of the present invention the aqueous solution includes deionized water and wherein the weight ratio of the deionized water to either HF or HCl ranges from about 20:1 to 6:5.

In another embodiment of the invention the low dielectric constant material is hydrophobic.

In another embodiment of the invention the low dielectric constant material comprises an organosilicon.

In another embodiment to the invention the low dielectric constant material comprises an organic based film.

These and other objects, features and advantages of the present invention will become apparent from the following brief description of the drawings, detailed description of the preferred embodiments and appended claims and drawings.

DETAILED DESCRIPTION OF THE PREFERRED EMBODIMENTS

Figure 3:
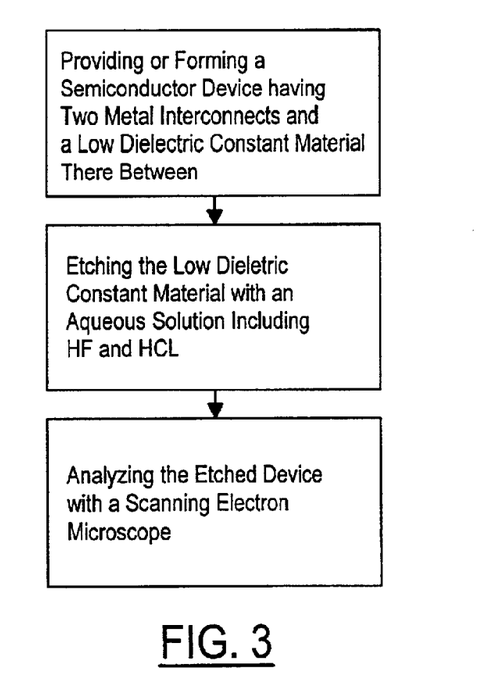
FIG. 3 illustrates a process according to the present invention including the step of etching a low dielectric constant material.

As shown in FIG. 3, the present invention includes a method of forming a semiconductor device having a plurality of metal interconnects formed above active regions a silicon base substrate and a low dielectric constant material between at least two metal interconnects. The semiconductor device with metal interconnects and interlayer dielectric may resemble the devices shown in FIG. 1 and FIG. 2M. However, the interlayer dielectric in the device has a low dielectric constant less than 3.8, and is less than the dielectric constant for a silicon dioxide. The low dielectric constant interlayer dielectric may be a doped silicon dioxide material such as fluorosilicate glass, an organic based material, an organosilicon film formed from a compound having a molecular formula of R—Si—R' where R and R' are the same or different and wherein R' is a hydrocarbon derived group typically comprising methyloxy (—OCH$_3$) or ethyloxy (—OC$_2$H$_5$). The method of the present invention is particularly useful in etching low dielectric constant materials that are water repulsive or hydrophobic, particularly those dielectric materials including a methyloxy group (—OCH$_3$). The method of the present invention may be utilized on a low dielectric constant materials such as those provided under the trade names of BLACK DIAMOND, CORAL, and SILK.

According to the present invention, at least one layer of a low dielectric constant interlayer dielectric in a semiconductor device is etched by an aqueous solution including hydrofluoric acid (HF) and hydrochloric acid (HCL). The weight ratio of HF to HCl in the aqueous solution may range from 1:3 to 4:1. Preferably the HF and HCl are dissolved in deionized water. The weight ratio of HF to deionized water may range from 1:20 to 6:5. Likewise, the weight ratio of HCl to deionized water may range from 1:20 to 6:5. The low dielectric constant material may be etched by spraying the etching solution onto the device, by pouring etching solution onto the device, or by dipping at least a portion of the device in a bath of the etching solution.

Devices having low dielectric constant materials may be etched by the method of the present invention and thereafter analyzed in a scanning electron microscope. The method of etching low dielectric constant materials may be utilized on devices which have been sectioned by a focused ion beam (FIB) system.

According to the present invention a semiconductor device having eight levels of copper metal interconnect was sectioned and etched with the solution prepared according to the present invention, wherein the solution included 20 ml of deionized water, 5 ml of a 49 weight percent aqueous hydrofluoric acid, and 5 ml of a 39 weight percent aqueous HCl. The etched device was analyzed under a scanning electron microscope and all eight levels of copper metal interconnect and corresponding interlayer dielectric layers having Si(CH$_3$)$_x$O$_{2-x}$ were clearly visible. The following is a chart of the measurements of the sectioned device as analyzed under the scanning electron microscope.

| Metal interconnect | measured spacing | | spacing spec. | thickness | width | | d1 | d2 |
|---|---|---|---|---|---|---|---|---|
| | top | bottom | | | top | bottom | | |
| M1 | 0.13 | 0.16 | 0.18 | 0.27 | 0.19 | 0.16 | 0.17 | 0.05 |
| M2 | 0.15 | 0.19 | 0.21 | 0.42 | 0.23 | 0.19 | 0.24 | 0.13 |
| M3 | 0.15 | 0.20 | 0.21 | 0.37 | 0.23 | 0.18 | 0.16 | 0.16 |
| M4 | 0.15 | 0.21 | 0.21 | 0.40 | 0.23 | 0.19 | 0.19 | 0.15 |
| M5 | 0.14 | 0.18 | 0.21 | 0.37 | 0.25 | 0.20 | 0.17 | 0.15 |
| M6 | 0.13 | 0.17 | 0.21 | 0.41 | 0.25 | 0.22 | 0.23 | 0.14 |
| M7 | 0.14 | 0.17 | 0.21 | 0.40 | 0.26 | 0.23 | 0.21 | 0.13 |
| M8 | 0.42 | 0.49 | 0.46 | 0.93 | 0.49 | 0.39 | 0.83 | 0.06 |

Where d1 is the IMD thickness between both SiC layers of the device and d2 is the IMD thickness below SiC to metal bottom. When another sample of the same type of device was etched with a traditional wet etching solution comprising 20 ml of deionized water, 612 ml of a 10:1 BOE, 42 ml of a 49 weight percent aqueous hydrochloric acid, and 420 ml of a 98 weight percent $CH_3COOH$, the etch stopped on the low dielectric constant material.

What is claimed is:

1. A method comprising:
   providing a semiconductor device having at least two metal interconnect layers and a dielectric layer comprising a low dielectric constant material between the metal interconnect layers;
   etching the device in aqueous solution of HF and HCl and so that the etching does not stop on the low dielectric constant material and the dielectric layer is etched.

2. A method as set forth in claim 1 wherein the weight ratio of HF to HCl in the solution ranges from 1:3 to 4:1.

3. A method as set forth in claim 1 wherein the low dielectric constant material includes —OR groups wherein R is a hydrocarbon derivative.

4. A method as set forth in claim 1 wherein the low dielectric constant includes methyloxy groups.

5. A method as set forth in claim 1 wherein the metal interconnect consists essentially of copper.

6. A method as set forth in claim 1 wherein the metal interconnect comprises aluminum.

7. A method as set forth in claim 1 wherein the step of etching the device is carried out by dipping the device in a bath of the aqueous solution of HF and HCl.

8. A method as set forth in claim 1 wherein the low dielectric constant material has a dielectric constant less than 3.8.

9. A method as set forth in claim 1 wherein the low dielectric constant material comprises fluorosilicate glass.

10. A method as set forth in claim 2 wherein the aqueous solution includes deionized water and wherein the weight ratio of the deionized water to either HF or HCl ranges from about 20:1 to 6:5.

11. A method as set forth in claim 1 wherein the low dielectric constant material is hydrophobic.

12. A method as set forth in claim 1 wherein the low dielectric constant material comprises an organosilicon.

13. A method as set forth in claim 1 wherein the low dielectric constant material comprises an organic based film.

14. A method as set forth in claim 1 further comprising analyzing the etched device in a scanning electron microscope.

* * * * *